(12) United States Patent
Chen et al.

(10) Patent No.: US 7,973,317 B2
(45) Date of Patent: Jul. 5, 2011

(54) ARRAY SUBSTRATE FOR LIQUID CRYSTAL DISPLAY AND METHOD FOR FABRICATING THE SAME

(75) Inventors: Yu-Cheng Chen, Hsinchu (TW); Chen-Yueh Li, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 12/752,192

(22) Filed: Apr. 1, 2010

(65) Prior Publication Data
US 2010/0187536 A1    Jul. 29, 2010

Related U.S. Application Data

(62) Division of application No. 12/128,664, filed on May 29, 2008, now Pat. No. 7,727,789.

(30) Foreign Application Priority Data

Sep. 27, 2007 (TW) .............................. 96135890 A

(51) Int. Cl.
*H01L 27/14*    (2006.01)

(52) U.S. Cl. .............................. 257/72; 349/38; 257/59

(58) Field of Classification Search ................. 257/59, 257/72; 349/38, 42, 43, 46
See application file for complete search history.

(56) References Cited

U.S. PATENT DOCUMENTS

| | | | |
|---|---|---|---|
| 6,137,551 A | 10/2000 | Jeong | |
| 2010/0051953 A1* | 3/2010 | Park | 257/59 |

* cited by examiner

*Primary Examiner* — Matthew C Landau
*Assistant Examiner* — Sonya D McCall Shepard
(74) *Attorney, Agent, or Firm* — Thomas|Kayden

(57) ABSTRACT

A method for fabricating an array substrate for a liquid crystal display (LCD) is provided. A semiconductor layer and a transparent lower electrode formed on a substrate is provided and covered by a first dielectric layer serving as a gate dielectric layer and a capacitor dielectric layer. A gate electrode and an upper electrode comprising a transparent electrode portion and a metal electrode portion are formed on the first dielectric layer and covered by a second dielectric layer. A source/drain electrode, a planarization layer, and a pixel electrode are sequentially formed on the second dielectric layer, in which the source/drain electrode is electrically connected to the semiconductor layer through the first and second dielectric layers and the pixel electrode is electrically connected to the source/drain electrode through the planarization layer. An array substrate for an LCD is also disclosed.

11 Claims, 26 Drawing Sheets

ARRAY SUBSTRATE FOR LIQUID CRYSTAL DISPLAY AND METHOD FOR FABRICATING THE SAME

CROSS REFERENCE TO RELATED APPLICATIONS

This application is a Divisional of pending U.S. patent application Ser. No. 12/128,664, filed May 29, 2008, which claims priority of Taiwan Patent Application No. 096135890, filed on Sep. 27, 2007, the entirety of which is incorporated by reference herein.

BACKGROUND OF THE INVENTION

1. Field of the Invention

The invention relates to liquid crystal display technology and in particular to an array substrate for a liquid crystal display (LCD) and a method for fabricating thereof, in which the array substrate comprises a pixel structure with high aperture ratio (AR).

2. Description of the Related Art

Liquid crystal displays (LCDs) are widely employed as a flat panel display in electronic products, such as portable personal computers, digital cameras, projectors, and the like, due to thin profile and low power consumption characteristics of LCDs, A typical LCD includes an array substrate, a color filter (CF) substrate, and a liquid crystal layer disposed therebetween. The array substrate contains a plurality of matrix pixels correspondingly connecting to a plurality of data lines and a plurality of scan lines, and a plurality of pixel driving circuits consisting of a plurality of electric devices, such as thin film transistors (TFTs) and storage capacitors. A TFT is employed for applying a voltage to a pixel. A storage capacitor is employed for maintaining pixel information during a nonselective period of voltage application. For conventional array substrate fabrication, the storage capacitor uses the common electrode as an upper or lower electrode, which is in the pixel region and parallel to the scan line. Moreover, the area of the common electrode is large to obtain a storage capacitor having a large capacity.

However, since the common electrode typically comprises opaque metal, the aperture ratio (AR) of the pixel is reduced when the area of the capacitor electrode is increased for increasing the capacity. Thus, the power of the backlight module must be increased to maintain the brightness of the LCD. As a result, power consumption is increased.

Therefore, there exists a need for an improved array substrate capable of increasing AR of the pixels while maintaining the capacity of the storage capacitors.

BRIEF SUMMARY OF INVENTION

A detailed description is given in the following embodiments with reference to the accompanying drawings. An embodiment of a method for fabricating an array substrate for a liquid crystal display (LCD) is provided. A substrate having a transistor and storage capacitor regions is provided. A semiconductor layer and a transparent lower electrode are formed on the transistor region and the storage capacitor region of the substrate, respectively. The semiconductor layer and a transparent lower electrode are covered by a first dielectric layer to serves as a gate dielectric layer in the transistor region and a capacitor dielectric layer in the storage capacitor region. A gate electrode and an upper electrode are formed on the first dielectric layer in the transistor region and the storage capacitor region, respectively, wherein the upper electrode comprises a transparent electrode portion and a metal electrode portion. A second dielectric layer is formed on the first dielectric layer and covers the gate electrode and the upper electrode. A source/drain electrode, electrically connected to the semiconductor layer through the first and second dielectric layers, is formed on the second dielectric layer in the transistor region. A planarization layer is formed on the second dielectric layer. A pixel electrode is formed on the planarization layer, which is electrically connected to the source/drain electrode through the planarization layer.

Another embodiment of an array substrate for an LCD comprises a substrate having a transistor region and a storage capacitor region, a thin film transistor, a storage capacitor, and a planarization layer. The thin film transistor is in the transistor region and comprises a semiconductor layer disposed on the substrate, a gate dielectric layer disposed on the semiconductor layer, a gate electrode disposed on the gate dielectric layer, and a source/drain electrode electrically connected to the semiconductor layer. The storage capacitor is in the storage capacitor region and comprises a transparent lower electrode disposed on the substrate, a capacitor dielectric layer disposed on the transparent lower electrode, and an upper electrode disposed on the capacitor dielectric layer, in which the upper electrode comprises a transparent electrode portion and a metal electrode portion. The planarization layer covers the thin film transistor and the storage capacitor. The pixel electrode is disposed on the planarization layer and electrically connects to the source/drain electrode through the planarization layer. The semiconductor layer and the transparent lower electrode are formed by the same polysilicon layer and the gate dielectric layer and the capacitor dielectric layer are formed by the same dielectric layer.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims. Embodiments of an array substrate for a liquid crystal display (LCD) and a fabrication method thereof are described with reference to the accompanying drawings.

Figure 1A:
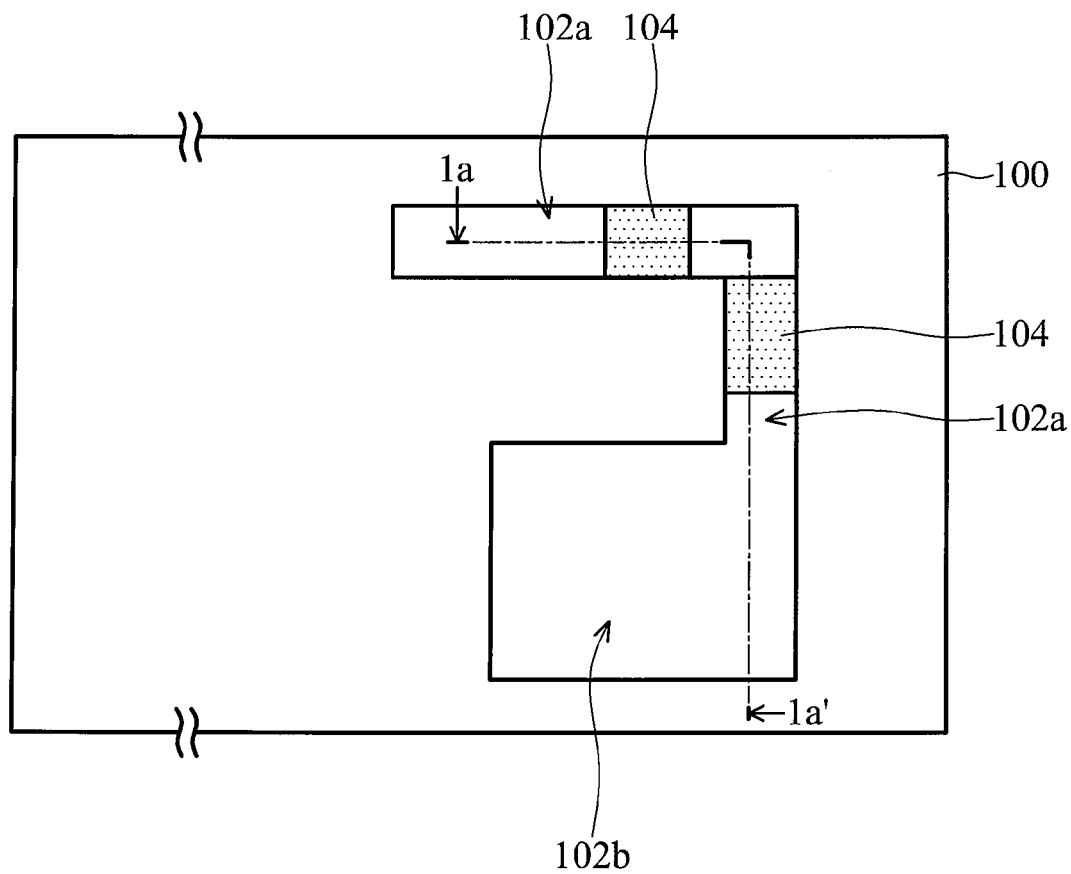
FIGS. 1A to 1E are plan views of an embodiment of a method for fabricating an array substrate for a liquid crystal display (LCD) according to the invention.
Figure 1B:
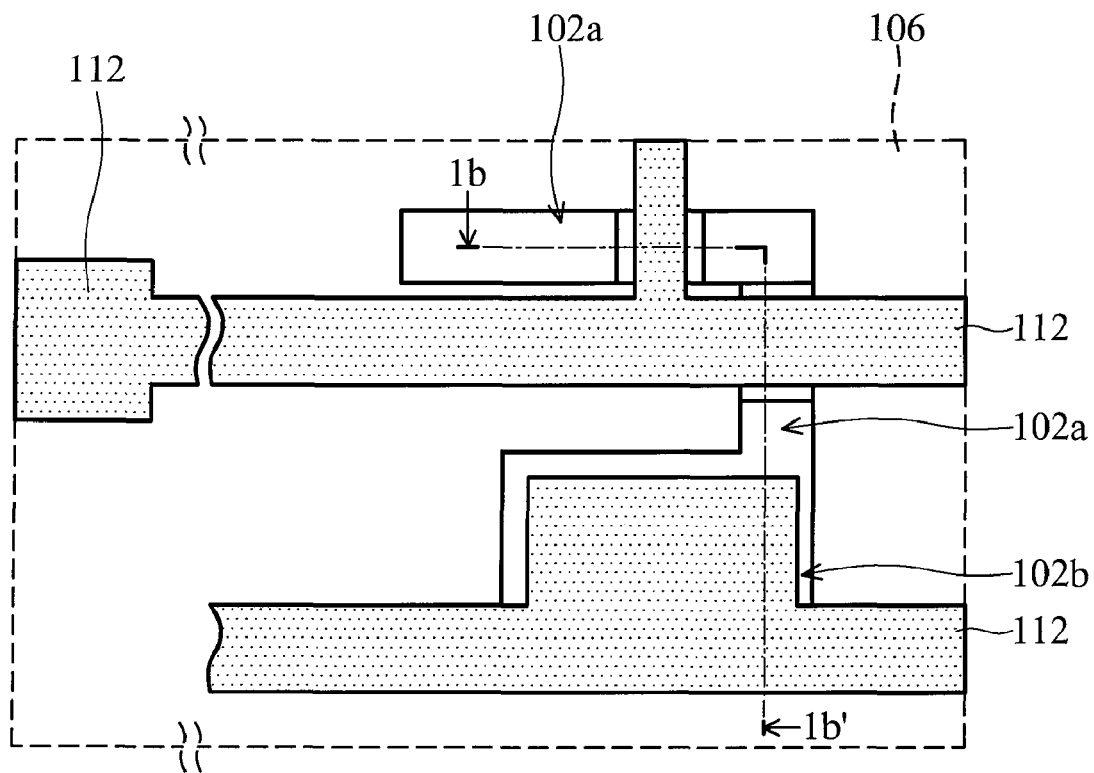
Figure 1C:
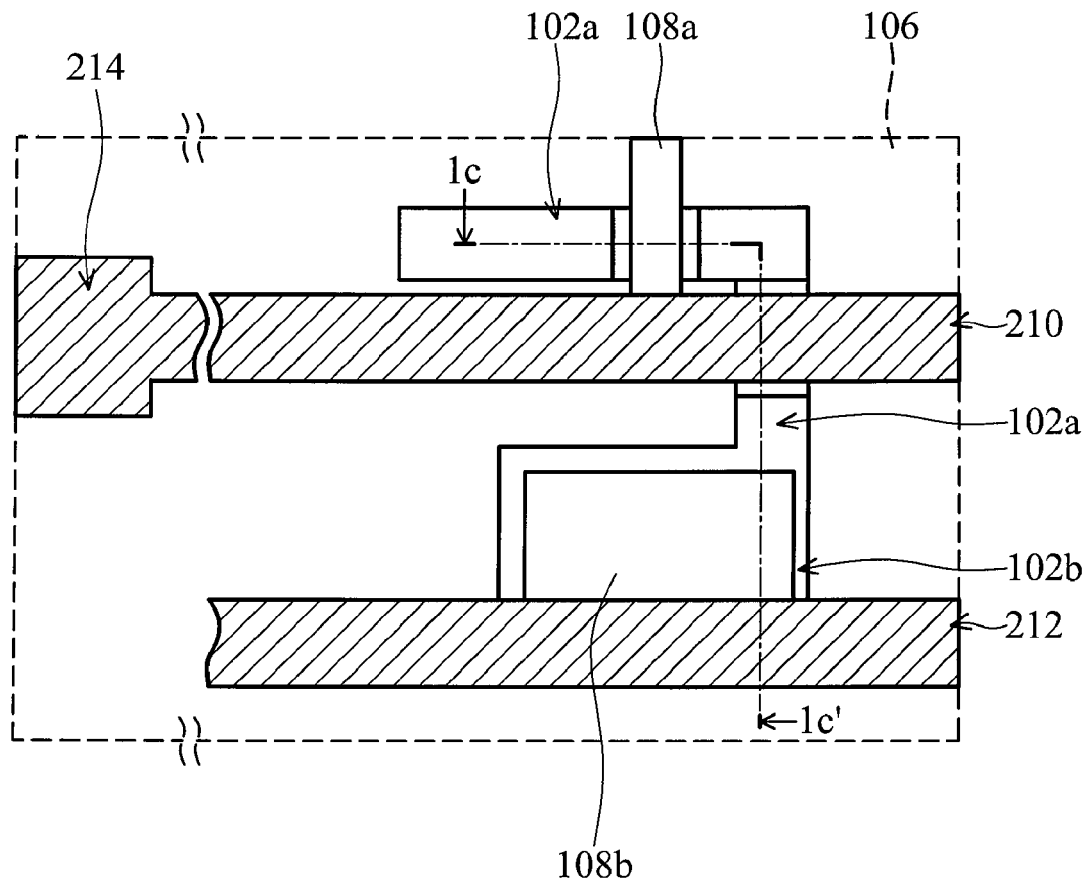
Figure 1D:
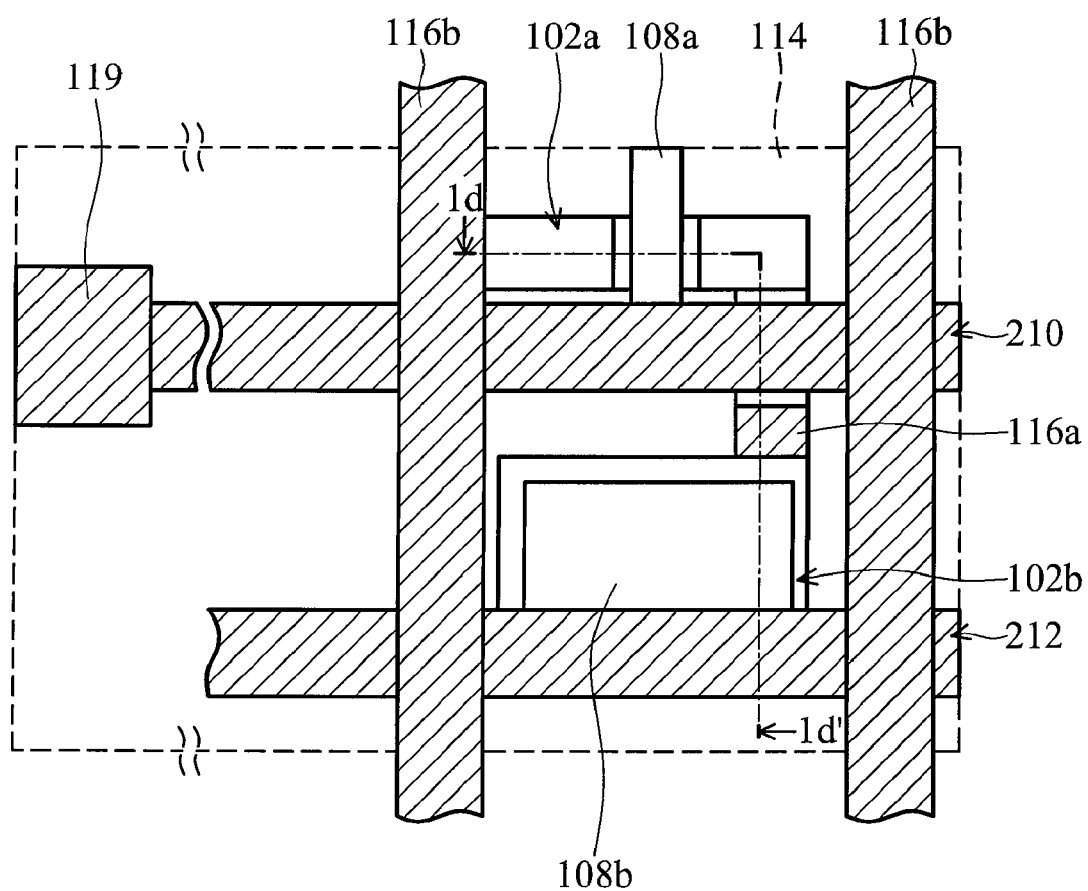
Figure 1E:
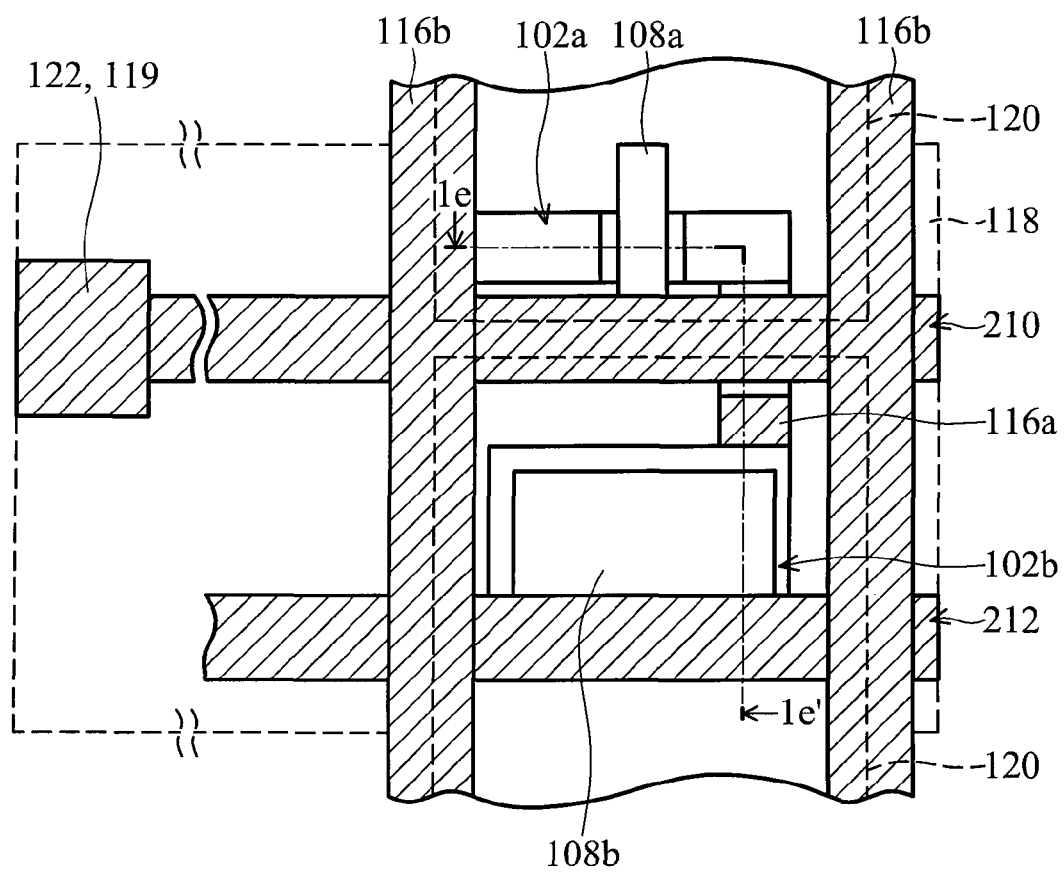
Figure 2A:
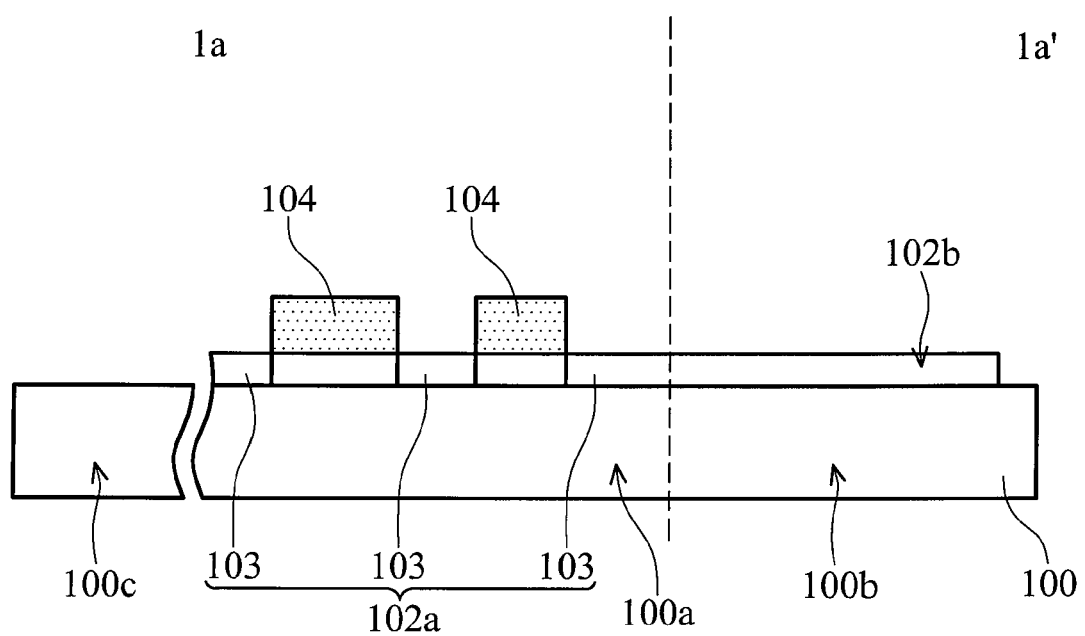
FIGS. 2A to 2E are cross sections along 1a-1a', 1b-1b', 1c-1c', 1d-1d', and 1e-1e' lines shown in FIGS. 1A to 1E, respectively.
Figure 2B:
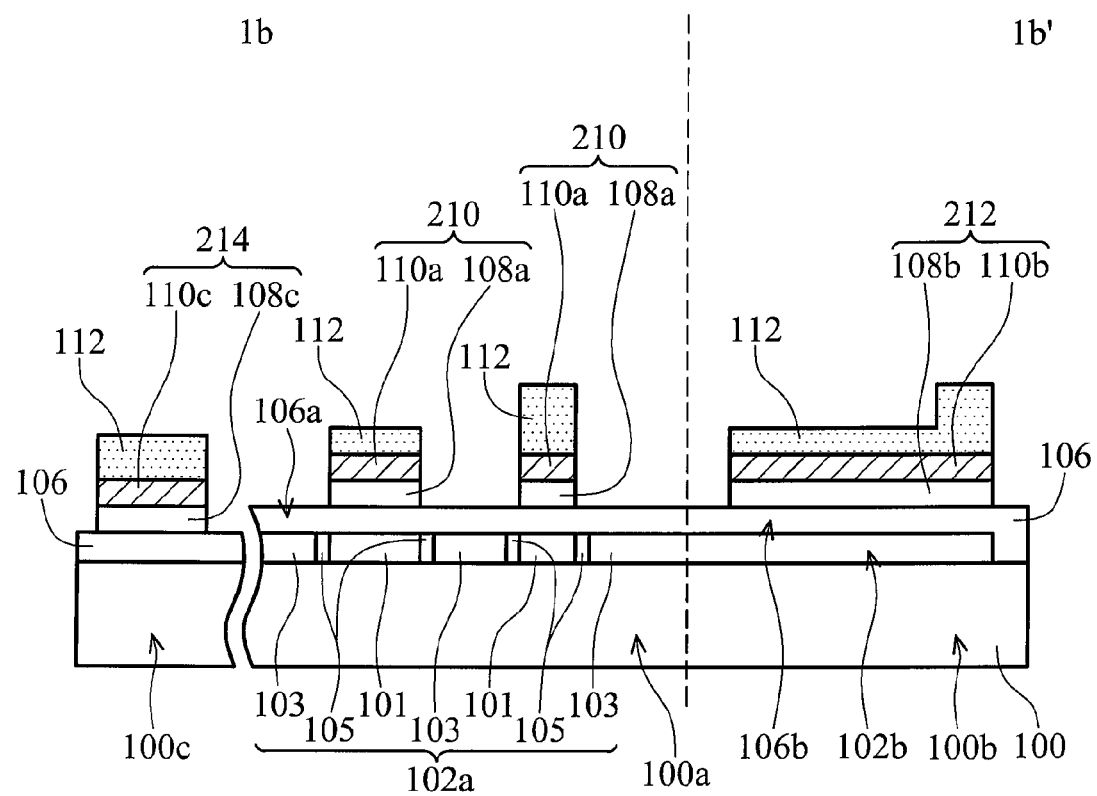
Figure 2C:
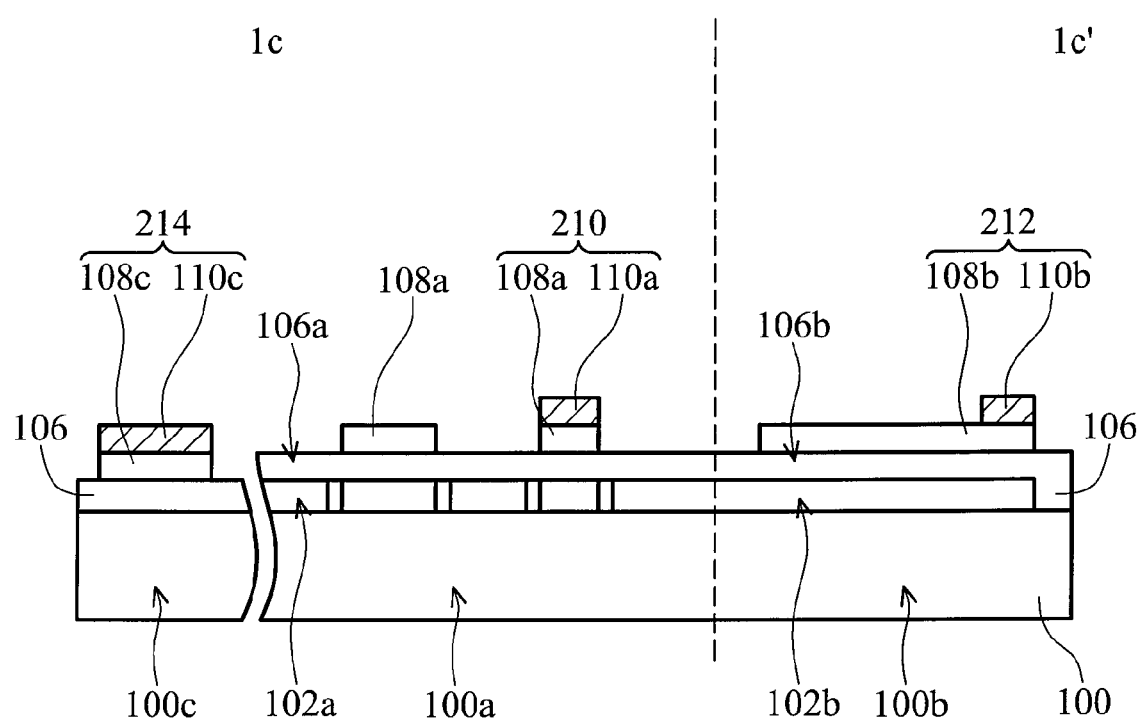
Figure 2D:
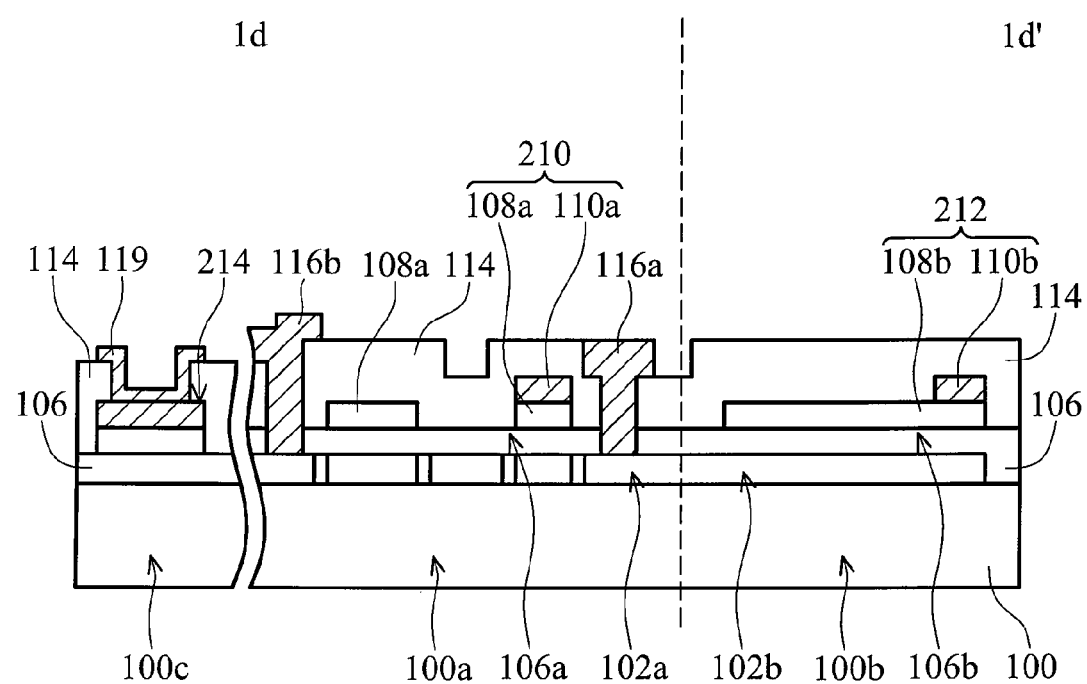
Figure 2E:
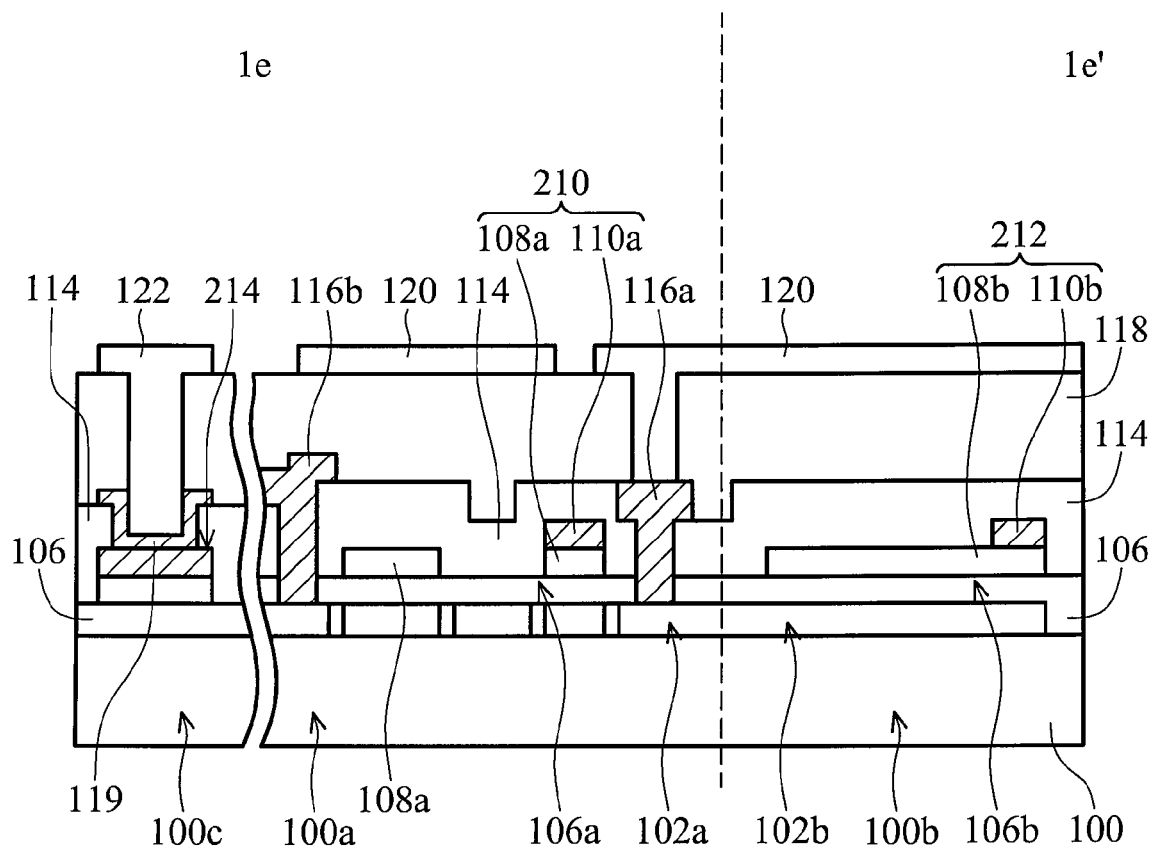

FIG. 1E is a plan view of an embodiment of an array substrate for an LCD according to the invention and FIG. 2E is a cross section along 1e-1e' line shown in FIG. 1E. The array substrate comprises a substrate 100, a plurality of thin film transistors, a plurality of storage capacitors, and a plurality of pads. In order to simplify the diagrams, only two thin film transistors, a storage capacitor and a pad 214 are depicted. In the embodiment, the substrate 100 has a transistor region 100a, a storage capacitor region 100b, and a pad region 100c. Moreover, the thin film transistors are disposed on the transistor region 100a of the substrate 100. Each thin film transistor comprises a semiconductor layer 102a disposed on the substrate 100, a gate dielectric layer 106a disposed on the semiconductor layer 102a, a gate electrode disposed on the gate dielectric layer 106a, and source/drain electrodes 116a and 116b electrically connected to the semiconductor layer 102a. Additionally, one of the two gate electrodes comprises a stacking gate layer 210 comprising a metal electrode portion 110a and an underlying transparent electrode portion 108a, serving as a gate line. The other gate electrode comprises the single transparent electrode portion 108a comprising, for example, indium tin oxide (ITO) or indium zinc oxide (IZO). Moreover, the source/drain electrode 116b may be made of metal and serve as a data line.

The storage capacitor is disposed on the storage capacitor region 100b of the substrate 100 and comprises a transparent lower electrode 102b disposed on the substrate 100, a capacitor dielectric layer 106b disposed on the transparent lower electrode 102b, and an upper electrode 212 disposed on the capacitor dielectric layer 106b. In the embodiment, the transparent lower electrode 102b and the semiconductor layer 102a may be formed by the same material layer. The upper electrode 212 may comprise a transparent electrode portion 108b and an overlying metal electrode 110b portion, in which the metal electrode portion 110b serves as a common electrode and covers a portion of the transparent electrode portion 108b only. Moreover, the upper electrode 212 comprises the same material as the stacking gate layer 210. Additionally, the capacitor dielectric layer 106b and the gate dielectric layer 106a may be formed by an insulating layer 106.

The pad 214 is disposed on the pad region 100c of the substrate 100 and is separated from the substrate 100 by the insulating layer 106, comprising a transparent pad portion 108c and an overlying metal pad portion 110c. Moreover, the pad 214 may comprise the same material as the stacking gate layer 210.

A planarization layer 118 covers the thin film transistors, the storage capacitor, and the pad 214. Moreover, an interlayer dielectric (ILD) layer 114 may be disposed under the planarization layer 118 and cover the gate electrodes 108a and the stacking gate layer 210, the upper electrode 212 and the pad 214. The planarization layer 118 and the ILD layer 114 may be made of silicon nitride, silicon oxide, or a combination thereof. A pixel electrode 120, such as an ITO or IZO layer, is disposed on the planarization layer 118 and is electrically connected to the source/drain electrode 116a through the planarization layer 118. Additionally, a transparent interconnect 122 and an underlying metal interconnect 119 are electrically connected to the pad 214 through the planarization layer 118 and the ILD layer 114, in which the transparent interconnect 122 may be formed by the same material layer as the pixel electrode 120. Moreover, the metal interconnect 119 may be formed by the same material layer as source/drain electrodes 116a and 116b.

FIGS. 1A to 1E are plan views of an embodiment of a method for fabricating an array substrate for an LCD according to the invention and FIGS. 2A to 2E are cross sections along 1a-1a', 1b-1b', 1c-1c', 1d-1d', and 1e-1e' lines shown in FIGS. 1A to 1E, respectively.

Referring to FIGS. 1A and 2A, a substrate 100, for example, made of quartz or glass, is provided. The substrate 100 at least has a transistor region 100a, a storage capacitor region 100b, and a pad region 100c. A semiconductor layer 102a and a transparent lower electrode 102b are respectively formed on the transistor region 100a and the storage capacitor region 100b of the substrate 100. The semiconductor layer 102a and the transparent lower electrode 102b can be formed by the same material layer, such as an amorphous silicon layer or a polysilicon layer. For example, the semiconductor layer 102a and the transparent lower electrode 102b are made of polysilicon formed by lower temperature polysilicon (LTPS) process. Next, a photoresist pattern layer 104 is coated on the semiconductor layer 102a in the transistor region 100a for definition of source/drain regions in the semiconductor layer 102a. Heavy ion implantation is subsequently performed in the semiconductor layer 102a using the photoresist pattern layer 104 as an implant mask, thereby selectively doping the semiconductor layer 102a to form a plurality of heavily doped regions 103 serving as source/drain regions for thin film transistors.

Referring to FIGS. 1B and 2B, an insulating layer 106 is formed on the pad region 100c of the substrate 100 and covers the semiconductor layer 102a in the transistor region 100a and the transparent lower electrode 102b in the storage capacitor region 100b. The insulating layer 106 may comprise silicon oxide or other high k dielectric materials and may be formed by chemical vapor deposition (CVD) or other conventional deposition processes. The insulating layer 106 on the semiconductor layer 102a serves as a gate dielectric layer 106a and the insulating layer 106 on the transparent lower electrode 102b serves as a capacitor dielectric layer 106b.

A transparent conductive layer (not shown) and a metal layer (not shown) are sequentially formed on the insulating layer 106, in which the transparent conductive layer may be made of ITO or IZO. Moreover, the metal layer may be made of copper, aluminum, molybdenum or alloy thereof and be formed by CVD, physical vapor deposition (PVD) or other conventional deposition processes. Thereafter, a photolithography process is performed by using a half-tone mask, thereby forming photoresist pattern layers 112 with different thicknesses on the metal layer for definition of the gate of the transistor in the transistor region 100a, a capacitor upper electrode in the storage capacitor region 100b, and pad in the pad region 100c. For example, the photoresist pattern layer 112 in the storage capacitor region 100b has a first thickness region and a second thickness region, in which the first thickness region is thicker than the second thickness region and corresponds to a region for formation of a common electrode. Moreover, the thicknesses of two photoresist pattern layers 112 in the transistor region 100a are substantially equal to that of the first thickness region and the second thickness region, respectively. Additionally, the thickness of the photoresist pattern layer 112 in the pad region 100c is substantially equal to that of the first thickness region.

The metal layer and the transparent conductive layer uncovered by the photoresist pattern layers 112 are sequentially etched to form two stacking gate layers 210 comprising a metal electrode portion 110a and a transparent electrode portion 108a in the transistor region 100a, an upper electrode 212 comprising a metal electrode portion 110b and a transparent electrode portion 108b in the storage capacitor region 100b, and a pad 214 comprising a metal pad portion 110c and a transparent pad portion 108c in the pad region 100c. Thereafter, light ion implantation is performed in the semiconductor layer 102a using the photoresist pattern layers 112 as implant masks, to form lightly doped regions 105 therein and adjacent to the heavily doped regions 103, thereby serving as lightly doped drain (LDD) regions for transistors and defining channel regions 101 between the lightly doped regions 105.

Referring to FIGS. 1C and 2C, ashing and metal etching are sequentially performed to expose the transparent electrode portions 108a and 108b. Since the photoresist pattern layers 112 have different thicknesses, a portion of the metal electrode portion 110b in the storage capacitor region 100b is left to remain and serve as a common electrode. Moreover, a gate electrode comprising the transparent electrode portion 108a only and a stacking gate layer (i.e. a gate line) 210 comprising the transparent electrode portion 108a and the metal electrode portion 110a are formed in the transistor region 100a. Additionally, in the pad region 100c, the metal pad portion 110c is left to remain and form the pad 214 with a stacking structure.

Referring to FIGS. 1D and 2D, an interlayer dielectric (ILD) layer 114 is formed on the insulating layer 106 and covers the gate electrode 108a and the stacking gate layer 210 in the transistor region 100a, the upper electrode 212 in the storage capacitor region 100b, and the pad 214 in the pad region 100c. The ILD layer 114 may be made of silicon nitride, silicon oxide, or a combination thereof and may be formed by conventional deposition, such as CVD. The ILD layer 114 and the underlying insulating layer 106 are patterned by photolithography and etching processes, thereby forming openings therein to expose source/drain regions 103 and the pad 214. Next, a metal layer (not shown) is formed on the ILD layer 114 and fills the openings. The metal layer is patterned by photolithography and etching, to form source/drain electrodes 116a and 116b electrically connected to the semiconductor layer 102a in the transistor region 100a and form a metal interconnect 119 electrically connected to the pad 214 in the pad region 100c. The source/drain electrode 116b serves as a data line.

Referring to FIGS. 1E and 2E, a planarization layer 118 is formed on the ILD layer 114. The planarization layer 118 may comprise an organic material and be formed by coating. Moreover, the planarization layer 118 may also be made of silicon nitride, silicon oxide, or a combination thereof and be formed by conventional deposition, such as CVD. The planarization layer 118 is patterned by photolithography and etching processes, thereby forming openings therein to expose the source/drain electrode 116a and the metal interconnect 119. Next, a transparent conductive layer (not shown), such as an ITO layer, is formed on the planarization layer 118 and fills the openings. The transparent conductive layer is subsequently patterned by photolithography and etching processes to form a pixel electrode 120 in the transistor region 100a and the storage capacitor region 100b, and the pixel electrode 120 is electrically connected to the source/drain electrode 116a, and form a transparent interconnect 122 electrically connected to the metal interconnect 119 in the pad region 100c.

Figure 3A:
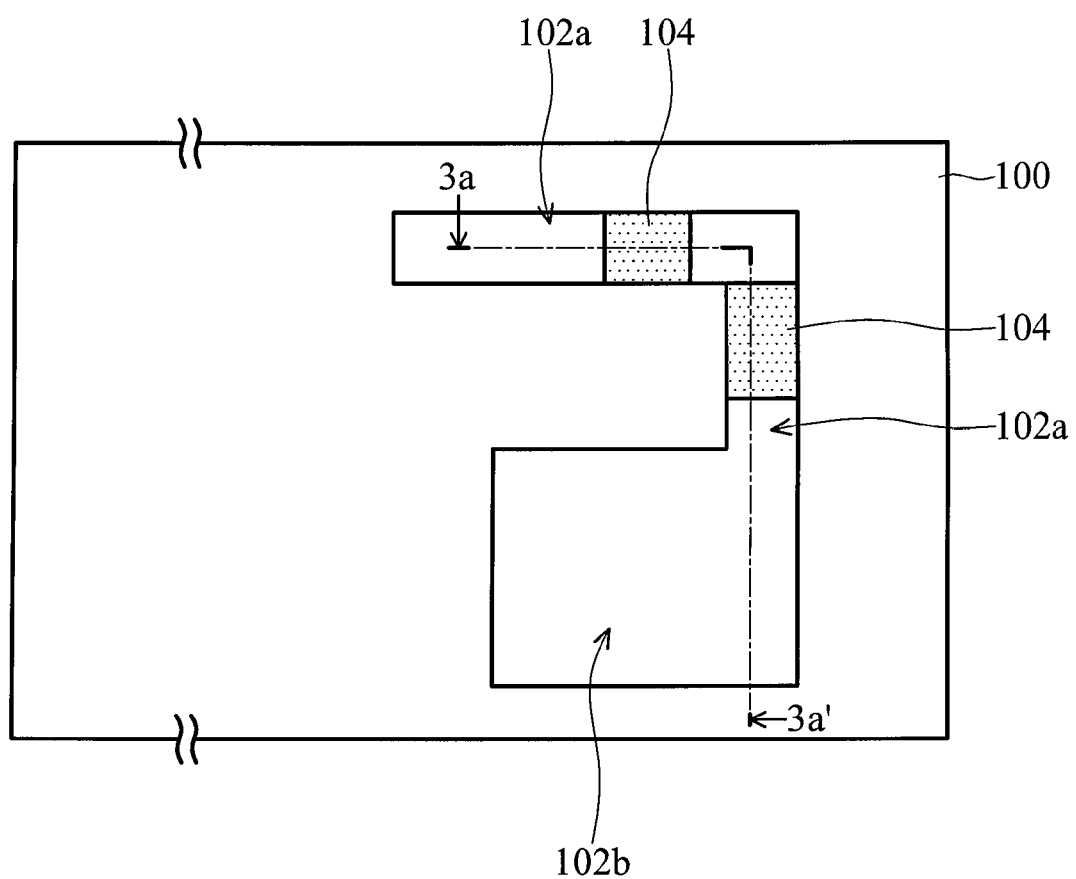
FIGS. 3A to 3D are plan views of another embodiment of a method for fabricating an array substrate for an LCD according to the invention.
Figure 3B:
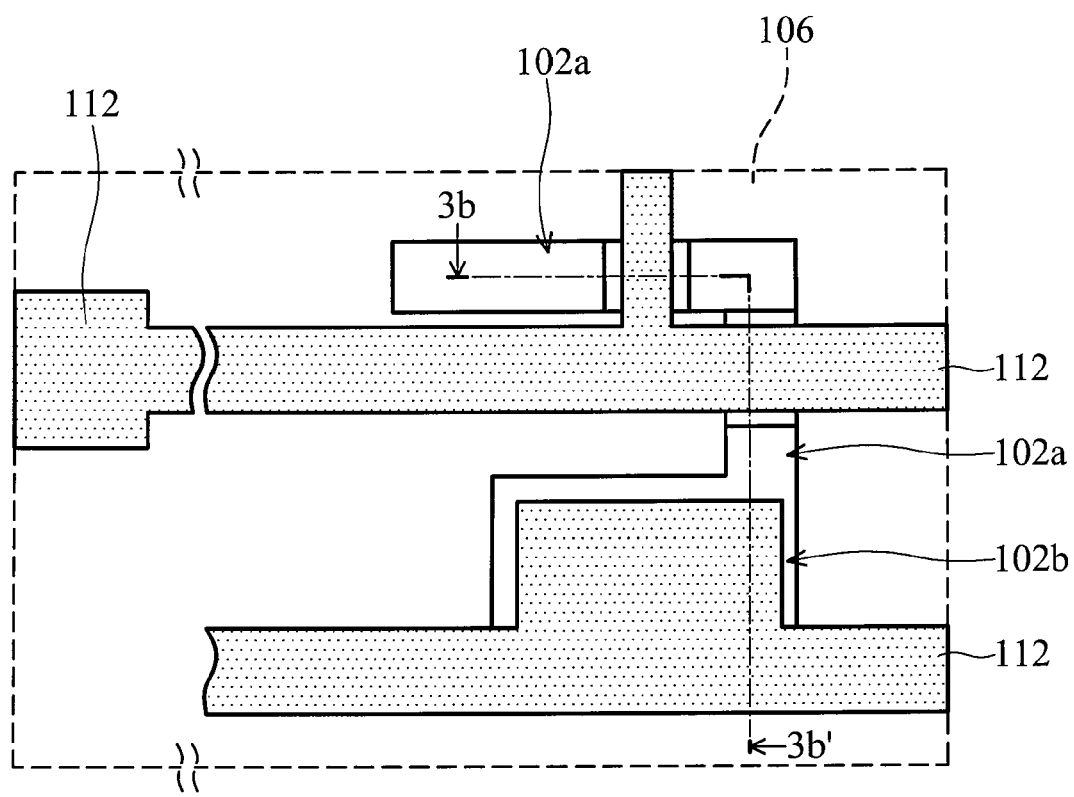
Figure 3C:
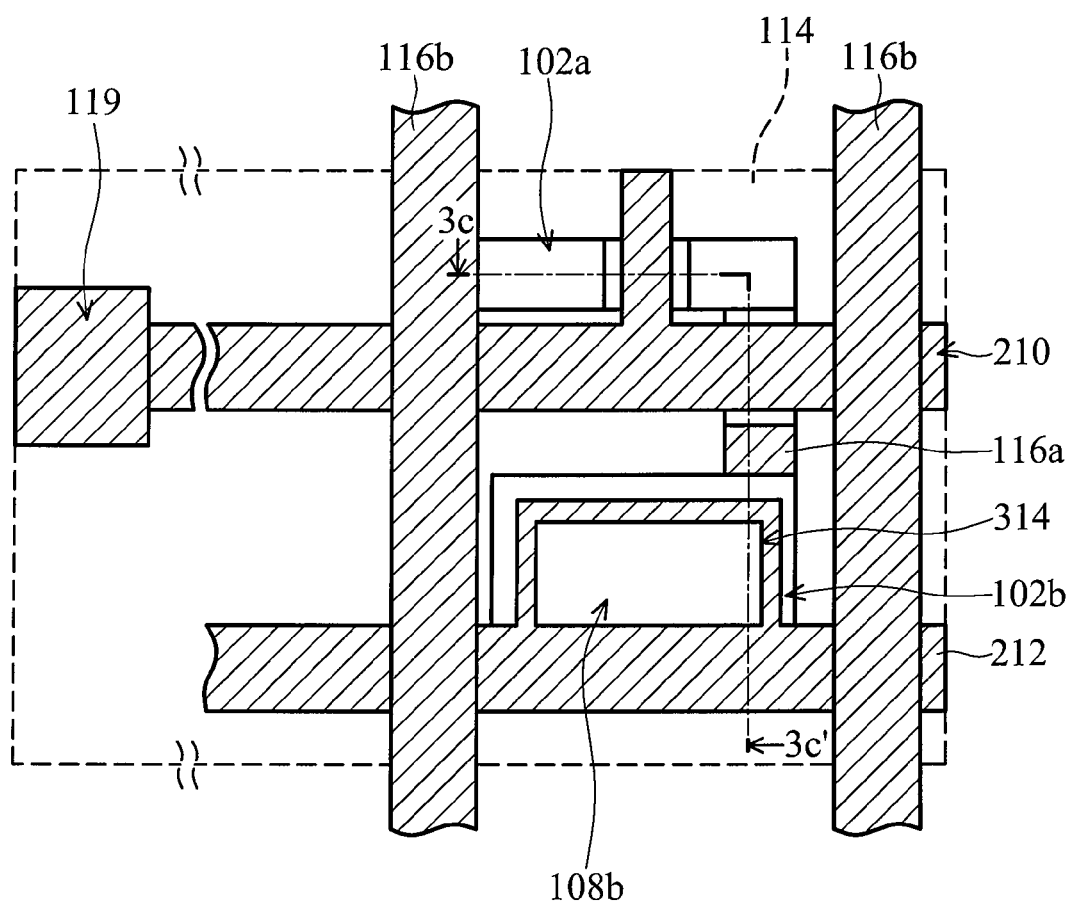
Figure 3D:
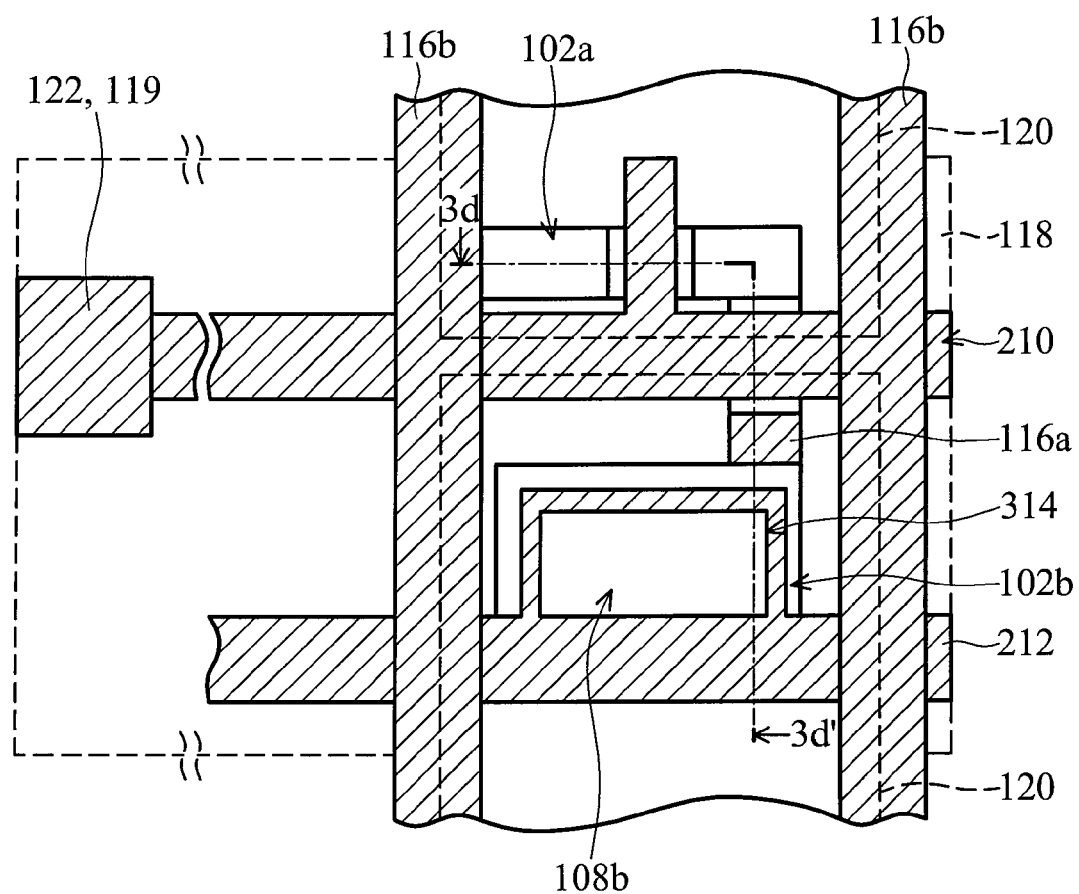
Figure 4A:
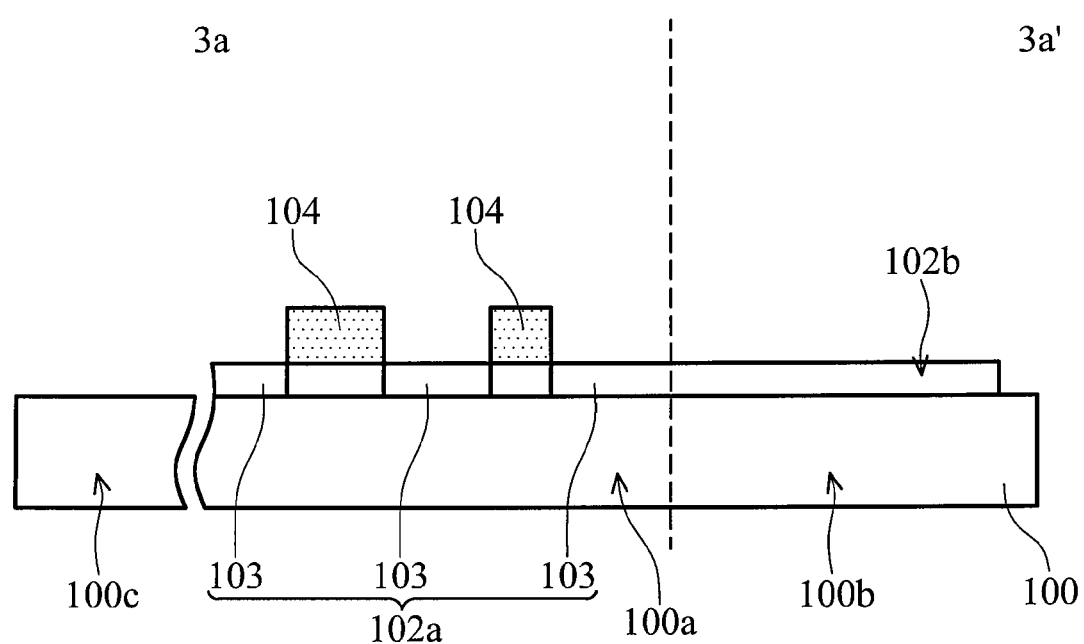
FIGS. 4A to 4D are cross sections along 3a-3a', 3b-3b', 3c-3c', and 3d-3d' lines shown in FIGS. 3A to 3D, respectively.
Figure 4B:
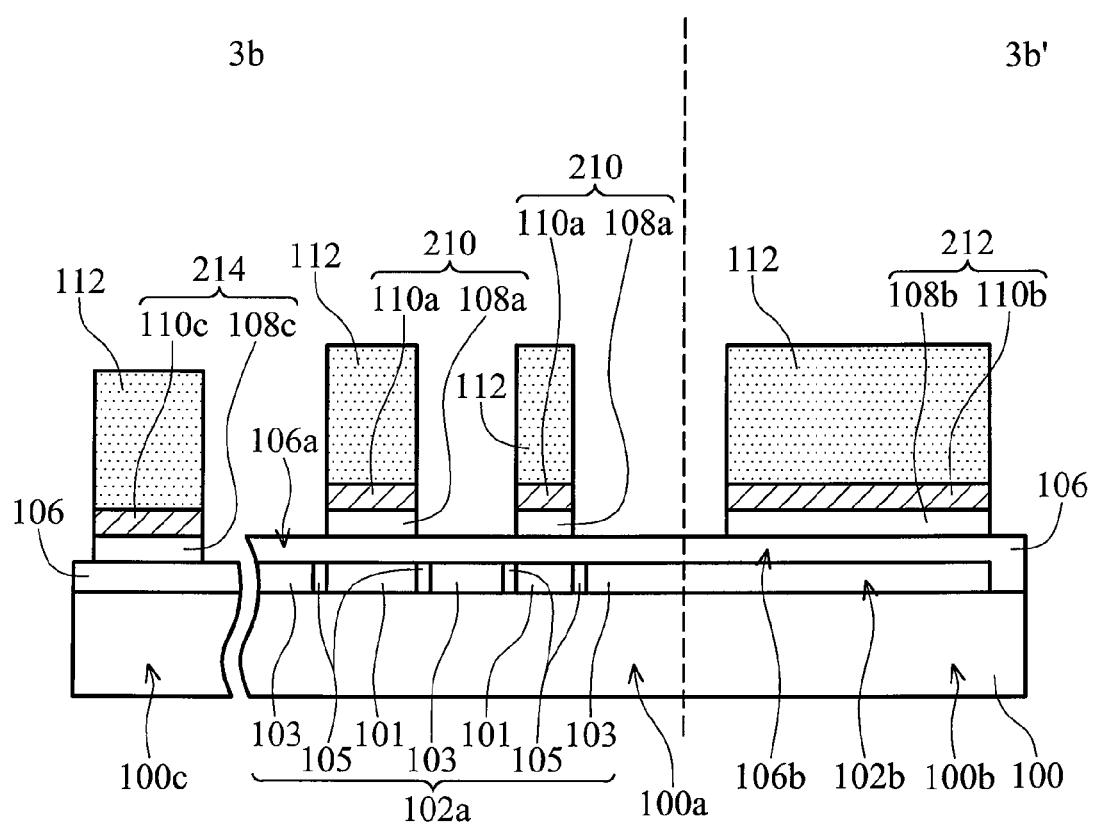
Figure 4C:
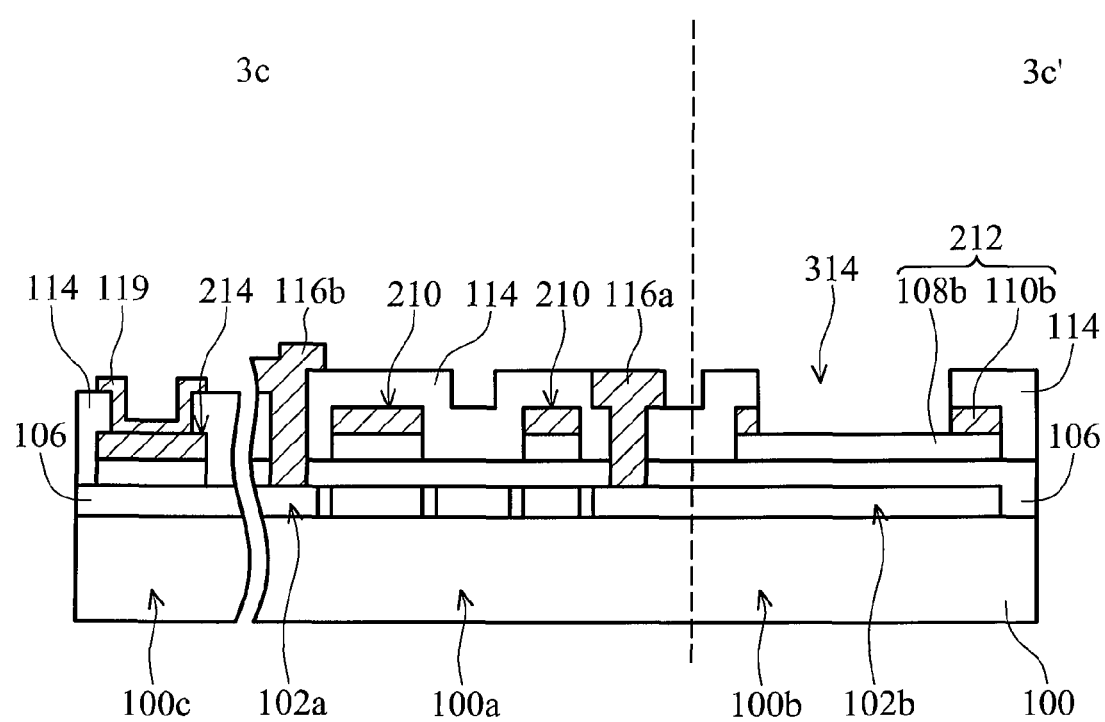
Figure 4D:
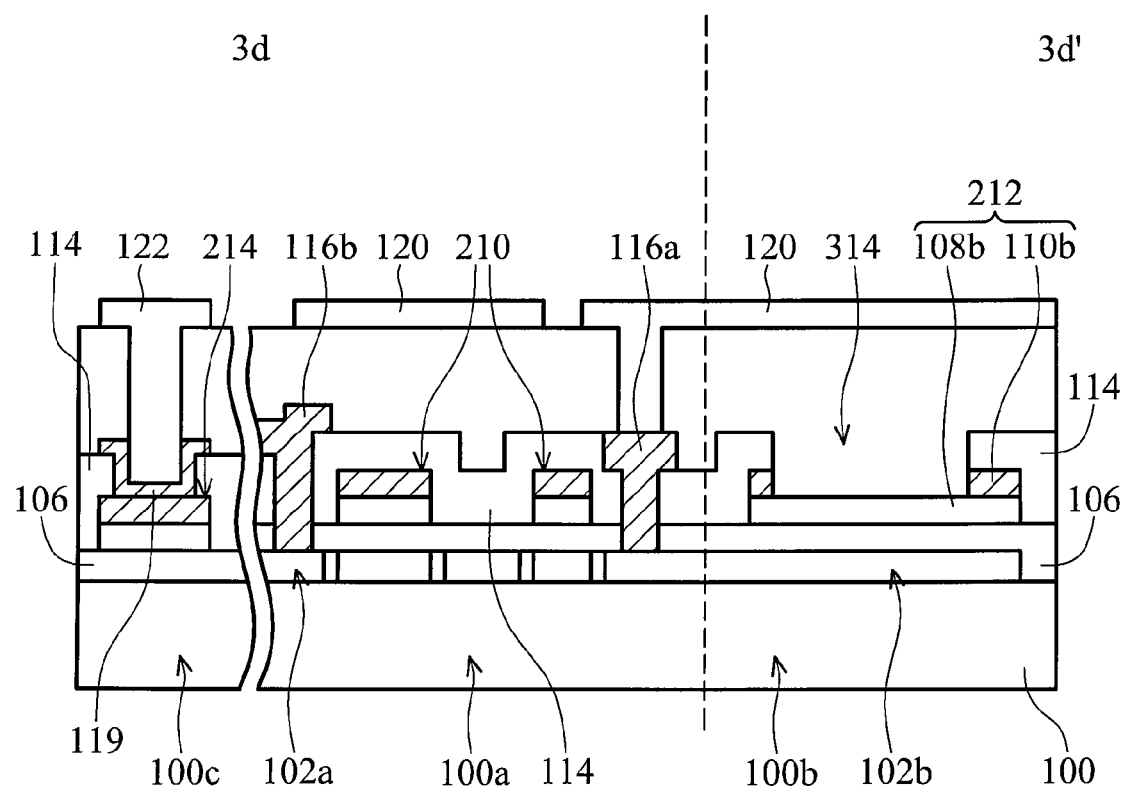

Referring to FIGS. 3D and 4D, in which FIG. 3D is a plan view of another embodiment of an array substrate for an LCD according to the invention and FIG. 4D is a cross section along 3d-3d' line shown in FIG. 3D. Moreover, Elements in FIGS. 3D and 4D that are the same as in FIGS. 1E and 2E are labeled the same and are not described further again for brevity. Unlike the embodiment shown in FIGS. 1E and 2E, in the embodiment, both gate electrodes in the transistor region 100a are formed of a stacking gate layer 210 comprising a metal electrode portion 110a and an underlying transparent electrode portion 108a.

Moreover, the upper electrode 212 in the storage capacitor region 100b comprises a transparent electrode portion 108b and an overlying metal electrode portion 110b, in which the metal electrode portion 110b has an opening therein to expose the underlying transparent electrode portion 108b, such that the metal electrode portion 110b substantially surrounds the transparent electrode portion 108b. The ILD layer 114 covering the upper electrode 212 has an opening substantially aligned the opening of the metal electrode portion 110b, such that the planarization layer 118 contacts the upper electrode 212 through these openings.

FIGS. 3A to 3D are plan views of another embodiment of a method for fabricating an array substrate for an LCD according to the invention and FIGS. 4A to 4D are cross sections along 3a-3a', 3b-3b', 3c-3c', and 3d-3d' lines shown in FIGS. 3A to 3D, respectively. Moreover, Elements in FIGS. 3A to 3D and 4A to 4D that are the same as in FIGS. 1A to 1E and 2A to 2E are labeled the same not described further again for brevity.

Referring to FIGS. 3A and 4A, a selectively doped polysilicon layer is formed on a substrate 100 by the same method shown in FIGS. 1A and 2A, comprising a semiconductor layer 102a in the transistor region 100a and a transparent lower electrode 102b in the storage capacitor region 100b.

Referring to FIGS. 3B and 4B, after an insulating layer 106 is formed on the substrate 100 and covers the semiconductor layer 102a and the transparent lower electrode 102b, a transparent conductive layer (not shown) and a metal layer are sequentially formed on the insulating layer 106. Thereafter, photolithography is performed to form photoresist pattern layers 112 having substantially the same thickness on the metal layer. The metal layer and the transparent conductive layer uncovered by the photoresist pattern layers 112 are sequentially etched to form two stacking gate layers 210 in the transistor region 100a, an upper electrode 212 in the storage capacitor region 100b, and a pad 214 in the pad region 100c. Thereafter, light ion implantation is performed in the semiconductor layer 102a to form lightly doped regions 105 therein for defining channel regions 101.

Referring to FIGS. 3C and 4C, after removal of the photoresist pattern layers 112, an ILD layer 114 is formed on the insulating layer 106 and covers the stacking gate layers 210 in the transistor region 100a, the upper electrode 212 in the storage capacitor region 100b, and the pad 214 in the pad region 100c. The ILD layer 114 and the underlying insulating layer 106 are patterned by photolithography and etching processes, thereby forming openings therein to expose source/drain regions 103 and the pad 214. Unlike the embodiment shown in FIGS. 1D and 2D, in this embodiment, an opening 314 is formed in the ILD layer 114 in the storage capacitor region 100b during patterning of the ILD layer 114, to expose a portion of the surface of the metal electrode portion 110b of the upper electrode 212. Next, a metal layer (not shown) is formed on the ILD layer 114 and fills the openings. The metal layer is patterned by photolithography and etching to form source/drain electrodes 116a and 116b in the transistor region 100a and form a metal interconnect 119 in the pad region 100c. At the same time, the exposed metal electrode portion 110b in the storage capacitor region 100b is removed, such that the metal electrode portion 110b remains and substantially surrounds the transparent electrode portions 108b.

Referring to FIGS. 3D and 4D, a planarization layer 118 is formed on the ILD layer 114 by the similar method shown in FIGS. 1E and 2E, in which the planarization layer 118 further contacts the upper electrode 212 through an opening formed in the planarization layer 118. Thereafter, a pixel electrode 120 is formed on the planarization layer 118, and is electrically connected to the source/drain electrode 116a in the transistor region 100a through the planarization layer 118. At the same time, a transparent interconnect 122 is formed on the planarization layer 118, and is electrically connected to the metal interconnect 119 in the pad region 100c through the planarization layer 118.

Figure 5A:
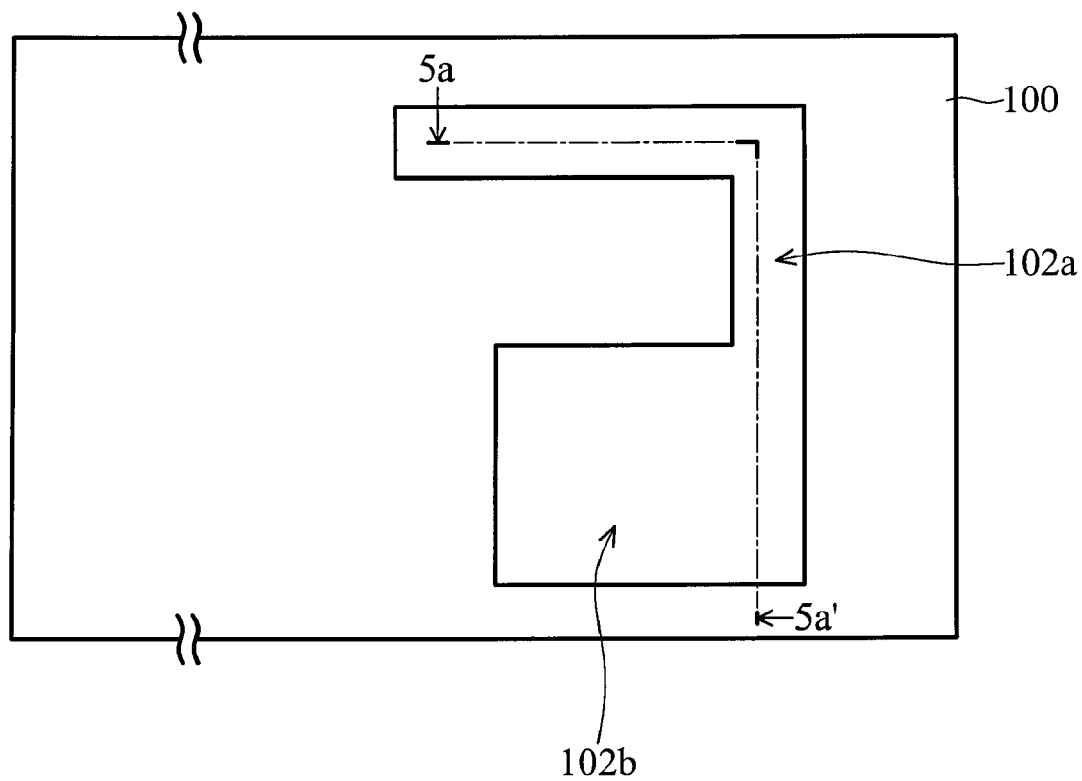
FIGS. 5A to 5D are plan views of another embodiment of a method for fabricating an array substrate for an LCD according to the invention.
Figure 5B:
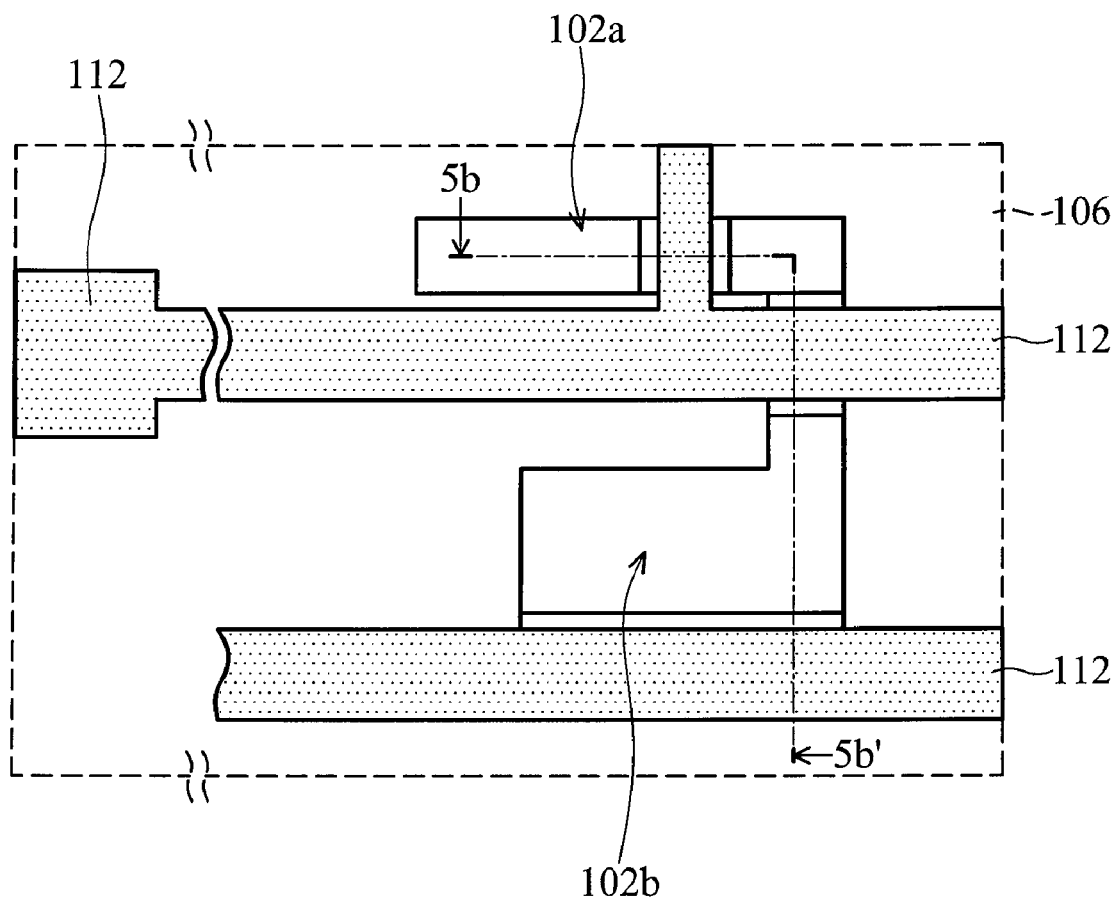
Figure 5C:
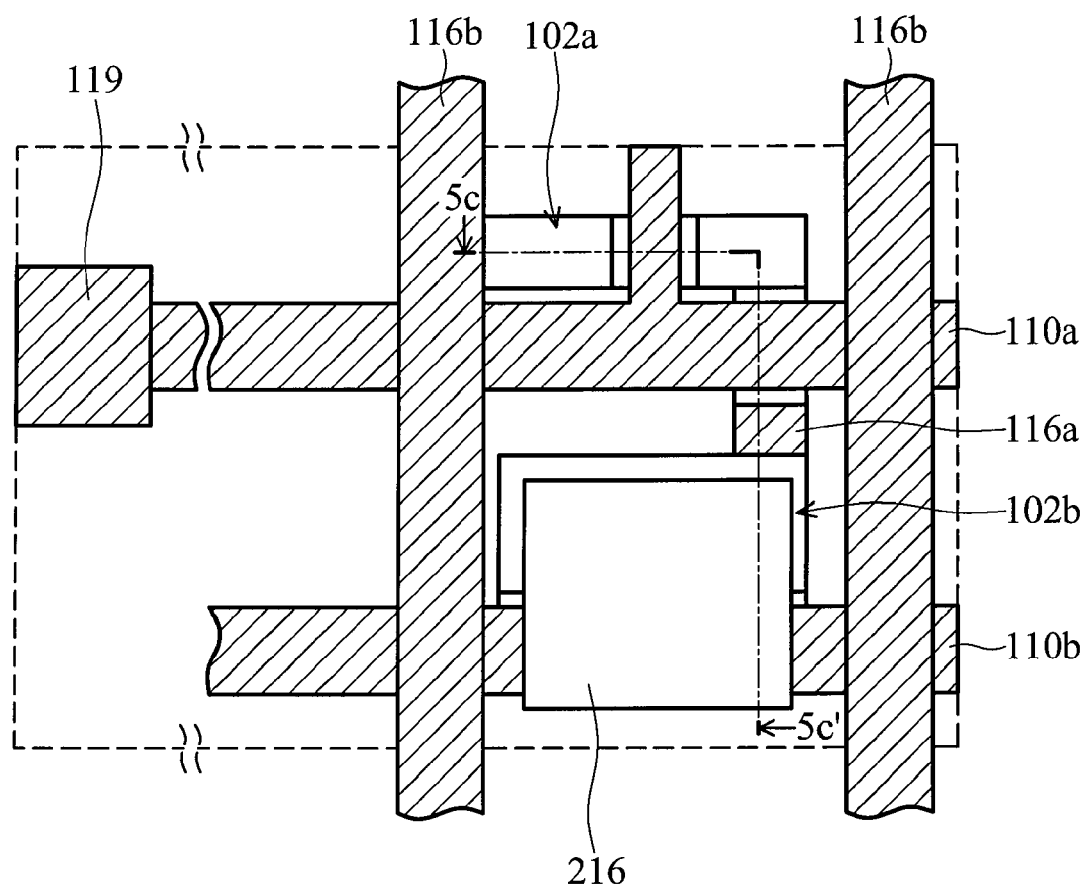
Figure 5D:
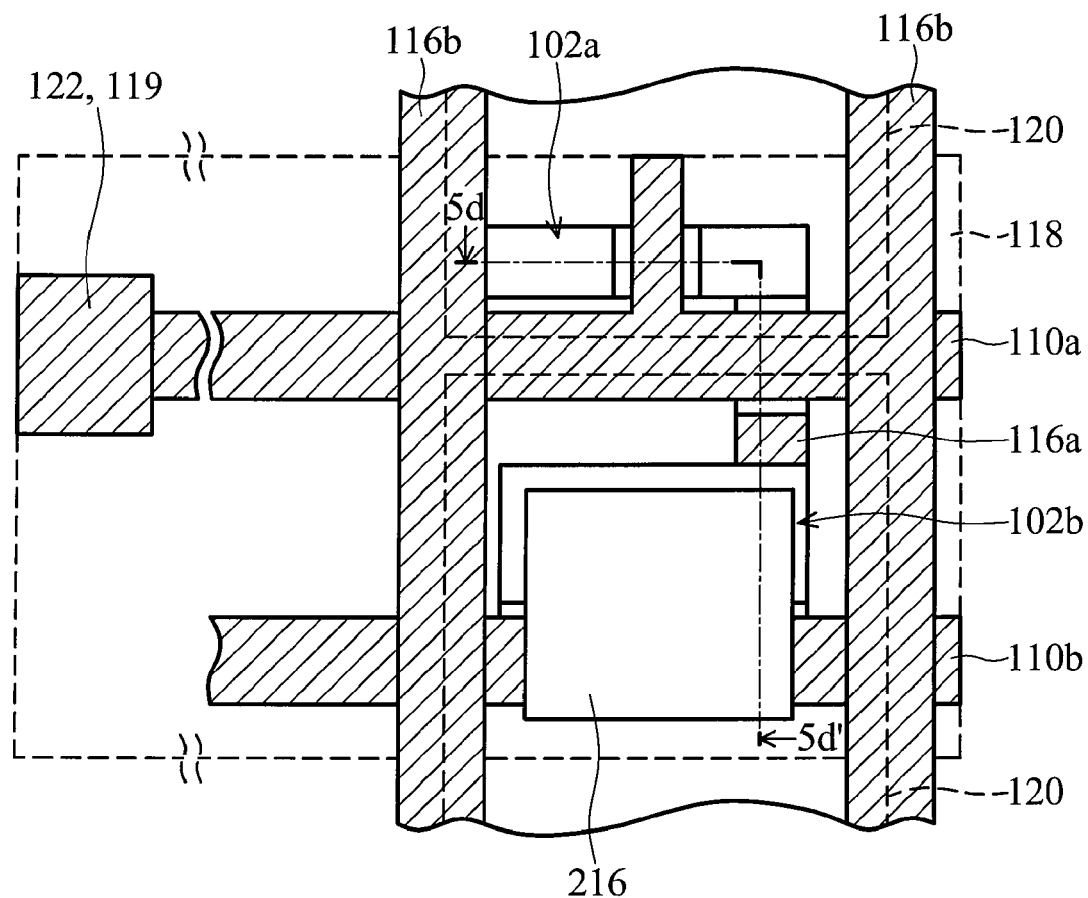
Figure 6A:
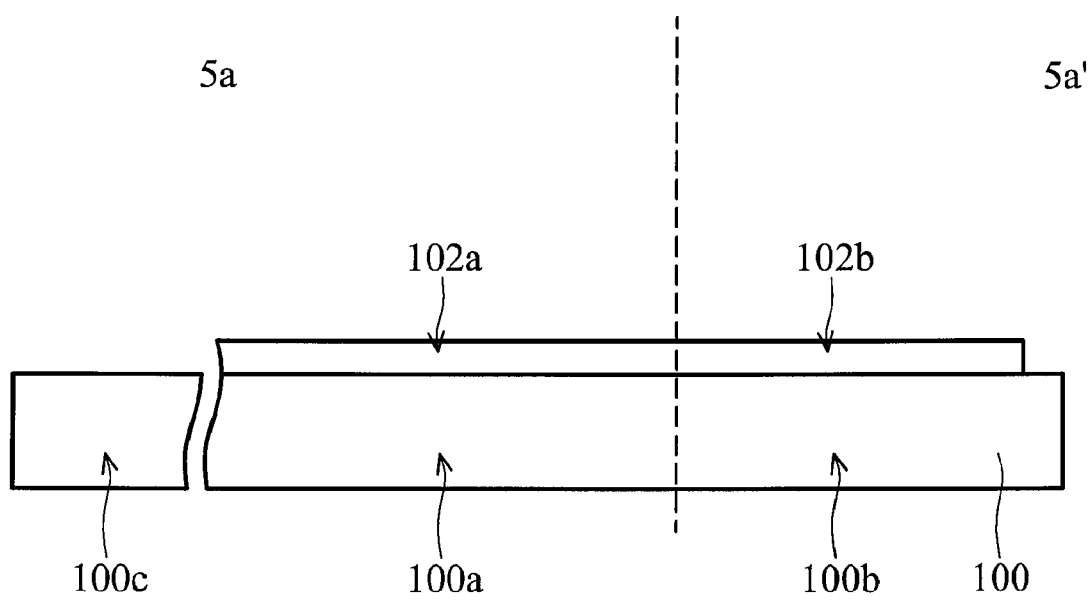
FIGS. 6A to 6D are cross sections along 5a-5a', 5b-5b', 5c-5c', and 5d-5d' lines shown in FIGS. 5A to 5D, respectively.
Figure 6B:
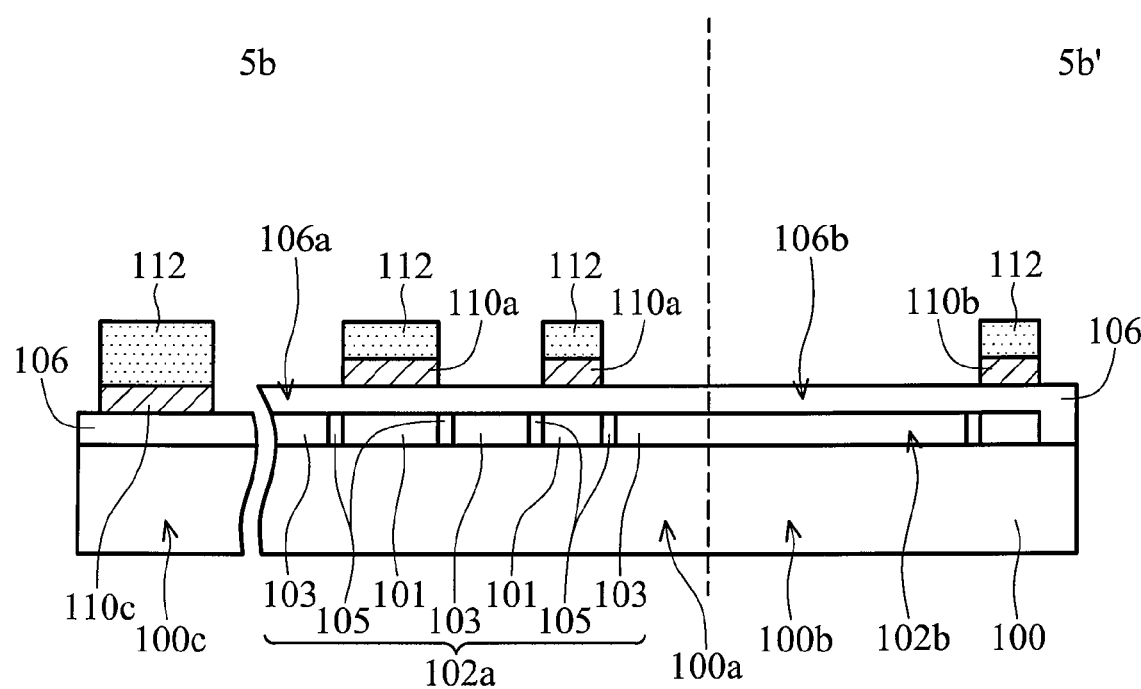
Figure 6C:
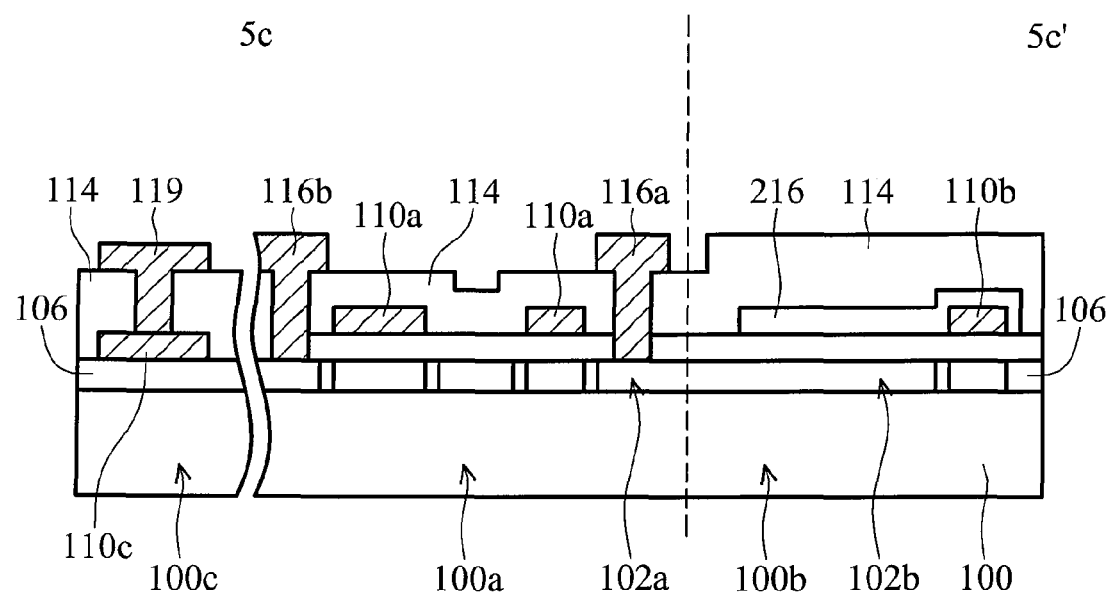
Figure 6D:
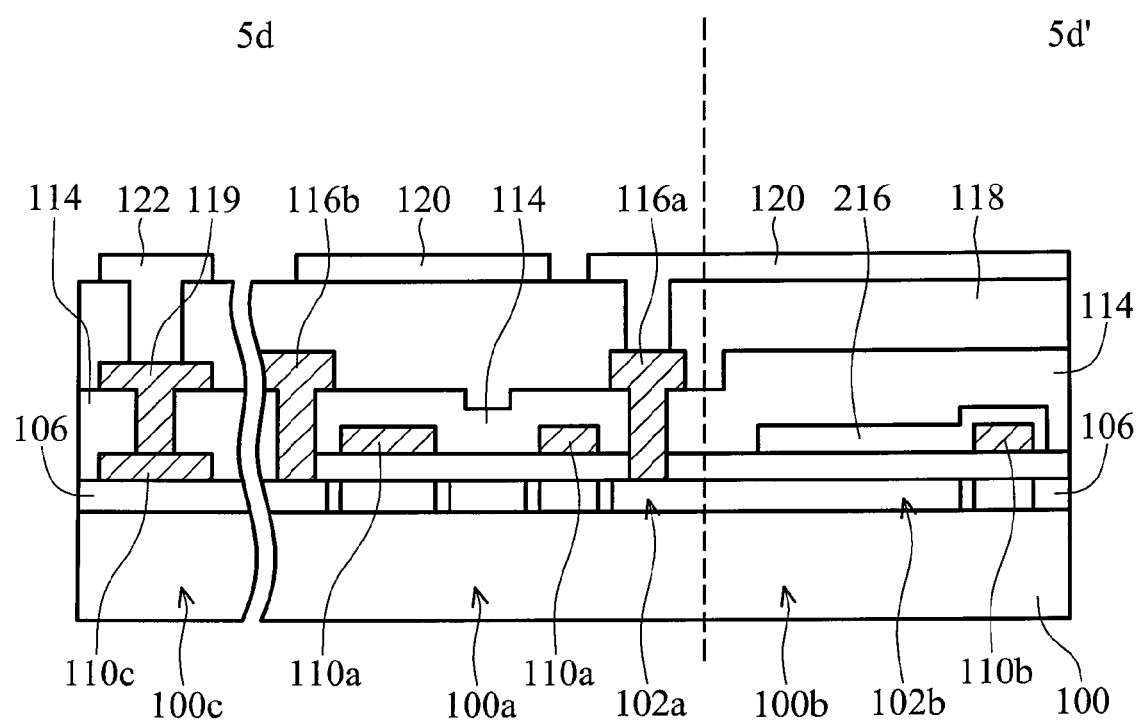

Referring to FIGS. 5D and 6D, in which FIG. 5D is a plan view of another embodiment of an array substrate for an LCD according to the invention and FIG. 6D is a cross section along 5d-5d' line shown in FIG. 5D. Moreover, elements in FIGS. 5D and 6D that are the same as in FIGS. 1E and 2E are labeled the same and are not described further again for brevity. Unlike the embodiment shown in FIGS. 1E and 2E, in this embodiment, both gate electrodes in the transistor region 100a are formed of a single metal electrode portion 110a without a transparent electrode portion 108a thereunder.

Moreover, the upper electrode 212 in the storage capacitor region 100b comprises a transparent electrode portion 108b and a metal electrode portion 110b, in which the metal electrode portion 110b is located under a portion of the transparent electrode portion 108b and serves as a common electrode.

FIGS. 5A to 5D are plan views of another embodiment of a method for fabricating an array substrate for an LCD according to the invention and FIGS. 6A to 6D are cross sections along 5a-5a', 5b-5b', 5c-5c', and 5d-5d' lines shown in FIGS. 5A to 5D, respectively. Moreover, Elements in FIGS. 5A to 5D and 6A to 6D that are the same as in FIGS. 1A to 1E and 2A to 2E are labeled the same and are not described further again for brevity.

Referring to FIGS. 5A and 6A, a polysilicon layer is formed on a substrate 100, comprising a semiconductor layer 102a in the transistor region 100a and a transparent lower electrode 102b in the storage capacitor region 100b.

Referring to FIGS. 5B and 6B, after an insulating layer 106 is formed on the substrate 100 and covers the semiconductor layer 102a and the transparent lower electrode 102b, a metal layer (not shown) is formed on the insulating layer 106. Thereafter, photolithography is performed to form photoresist pattern layers 112 having substantially the same thickness on the metal layer. The metal layer uncovered by the photoresist pattern layers 112 is etched to form two metal electrode portion 110a in the transistor region 100a, a metal electrode portion 110b in the storage capacitor region 100b, and a metal pad portion 110c in the pad region 100c. Thereafter, heavy ion implantation is performed in the semiconductor layer 102a using the photoresist pattern layers 112 as implant masks, to selectively dope the semiconductor layer 102a, thereby forming heavily doped regions 103 therein. Each photoresist pattern layer 112 is pulled-back to expose portions of the metal gate electrode portions 110a and 110b and metal pad portion 110c. Next, the exposed metal gate electrode portions 110a and 110b and metal pad portion 110c are removed by etching, to form gate electrodes in the transistor region and a pad in the pad region 100c. Light ion implantation is performed in the semiconductor layer 102a to form lightly doped regions 105 therein for defining channel regions 101.

Referring to FIGS. 5C and 6C, after removal of the photoresist pattern layers 112, a transparent conductive layer (not shown), such as an ITO layer, is formed on the insulating layer 106. The transparent conductive layer is patterned by photolithography and etching processes to form a transparent electrode portion 216 on the insulating layer 106 (i.e. capacitor dielectric layer 106b) in the storage capacitor region 100b and cover the metal electrode portion 110b. The transparent electrode portion 216 and the underlying metal electrode portion 110b serve as an upper electrode of a capacitor, in which the metal electrode portion 110b also serves as a common electrode. Thereafter, an ILD layer 114 is formed on the insulating layer 106 and covers both gate electrode portions 110a in the transistor region 100a, the transparent electrode portion 216 in the storage capacitor region 100b, and the metal pad portion 110c in the pad region 100c. The ILD layer 114 and the underlying insulating layer 106 are patterned by photolithography and etching, thereby forming openings therein to expose source/drain regions 103 and the metal pad portion 110c. Next, a metal layer (not shown) is formed on the ILD layer 114 and fills the openings. The metal layer is patterned by photolithography and etching processes to form source/drain electrodes 116a and 116b in the transistor region 100a and form a metal interconnect 119 in the pad region 100c.

Referring to FIGS. 5D and 6D, a planarization layer 118 is formed on the ILD layer 114 by the similar method shown in FIGS. 1E and 2E. Thereafter, a pixel electrode 120 is formed on the planarization layer 118, and is electrically connected to the source/drain electrode 116a in the transistor region 100a through the planarization layer 118. At the same time, a transparent interconnect 122 is formed on the planarization layer 118, and is electrically connected to the metal interconnect 119 in the pad region 100c through the planarization layer 118.

In the embodiments of the invention above, the upper electrode of the storage capacitor comprise a transparent electrode portion having a relatively large area and a metal electrode portion having a relatively small area, using the metal electrode portion as a common electrode. For a quarter video graphics array (QVGA) of a 2.2 inch display with 320×240 resolution, the aperture ratio of the array substrate according to the embodiments above can be increased about 2.15% compared to the conventional array substrate with a large area metal common electrode. Moreover, the transparent electrode portion having a large area can compensate the capacity loss of the storage capacitor due to area reduction of the common electrode. That is, according to the embodiments of the invention, the aperture ratio or transmission of the array substrate can be increased while maintaining the desired capacity of the storage capacitors. Additionally, in the embodiments of the invention above, since the gate electrode in the transistor region can be formed of a transparent conductive material, the aperture ratio or transmission of the array substrate can be further increased.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An array substrate for an LCD, comprising:
   a substrate having a transistor region and a storage capacitor region;
   a thin film transistor in the transistor region, comprising:
      a semiconductor layer disposed on the substrate;
      a gate dielectric layer disposed on the semiconductor layer;
      a gate electrode disposed on the gate dielectric layer; and
      a source/drain electrode electrically connected to the semiconductor layer;
   a storage capacitor in the storage capacitor region, comprising:

a transparent lower electrode disposed on the substrate;
a capacitor dielectric layer disposed on the transparent lower electrode; and
an upper electrode disposed on the capacitor dielectric layer and comprising a transparent electrode portion and a metal electrode portion;
a planarization layer covering the thin film transistor and the storage capacitor;
an interlayer dielectric layer between the planarization layer and the gate electrode and between the planarization layer and the upper electrode, wherein the interlayer dielectric layer above the upper electrode has an opening therein, such that the planarization layer contacts the upper electrode through the opening; and
a pixel electrode disposed on the planarization layer and electrically connected to the source/drain electrode through the planarization layer;
wherein the semiconductor layer and the transparent lower electrode are formed by the same polysilicon layer and the gate dielectric layer and the capacitor dielectric layer are formed by the same dielectric layer.

2. The array substrate of claim 1, wherein the gate electrode comprises a transparent conductive material.

3. The array substrate of claim 1, wherein the metal electrode portion is located above a portion of the transparent electrode portion.

4. The array substrate of claim 1, wherein the gate electrode and the upper electrode comprise the same material and the metal electrode portion is located above the transparent electrode portion.

5. The array substrate of claim 1, wherein a material of the gate electrode comprises metal.

6. The array substrate of claim 4, wherein the metal electrode portion of the upper electrode substantially surrounds the transparent electrode portion of the upper electrode.

7. The array substrate of claim 1, wherein a material of the planarization layer comprises silicon nitride, silicon oxide, or a combination thereof.

8. An array substrate for an LCD, comprising:
a substrate having a transistor region and a storage capacitor region;
a thin film transistor in the transistor region, comprising:
a semiconductor layer disposed on the substrate;
a gate dielectric layer disposed on the semiconductor layer;
a gate electrode disposed on the gate dielectric layer; and
a source/drain electrode electrically connected to the semiconductor layer;
a storage capacitor in the storage capacitor region, comprising:
a transparent lower electrode disposed on the substrate;
a capacitor dielectric layer disposed on the transparent lower electrode; and
an upper electrode disposed on the capacitor dielectric layer and comprising a transparent electrode portion and a metal electrode portion, wherein the metal electrode portion is located under a portion of the transparent electrode portion;
a planarization layer covering the thin film transistor and the storage capacitor; and
a pixel electrode disposed on the planarization layer and electrically connected to the source/drain electrode through the planarization layer;
wherein the semiconductor layer and the transparent lower electrode are formed by the same polysilicon layer and the gate dielectric layer and the capacitor dielectric layer are formed by the same dielectric layer.

9. The array substrate of claim 8, wherein the gate electrode comprises a transparent conductive material.

10. The array substrate of claim 8, wherein a material of the gate electrode comprises metal.

11. The array substrate of claim 8, wherein a material of the planarization layer comprises silicon nitride, silicon oxide, or a combination thereof.

* * * * *